United States Patent [19]
Wakita et al.

[11] Patent Number: 5,960,323
[45] Date of Patent: Sep. 28, 1999

[54] LASER ANNEAL METHOD FOR A SEMICONDUCTOR DEVICE

[75] Inventors: Ken Wakita; Hidenori Ogata, both of Motosu-gun, Japan

[73] Assignee: Sanyo Electric Co., Ltd., Osaka, Japan

[21] Appl. No.: 08/877,168

[22] Filed: Jun. 17, 1997

[30] Foreign Application Priority Data

Jun. 20, 1996 [JP] Japan ................................. 8-159949

[51] Int. Cl.⁶ .................................................. H01L 21/263
[52] U.S. Cl. ..................... 438/795; 438/482; 438/149; 438/799; 438/308; 438/486; 438/487
[58] Field of Search ................................. 438/795, 482, 438/486, 487, 149, 150, 799

[56] References Cited

U.S. PATENT DOCUMENTS

| | | | |
|---|---|---|---|
| 4,439,245 | 3/1984 | Wu | 438/795 |
| 4,466,179 | 8/1984 | Kasten | 438/795 |
| 5,306,651 | 4/1994 | Masumo et al. | 438/795 |

OTHER PUBLICATIONS

Electronic Display Forum '96 program cover sheet, Apr. 17–19, 1996.

List of presentations at Forum '96, including "Excimer Laser Annealing System SLA 3600", Apr. 19, No. 18.

M. Kamiya, K. Ando, K. Kim, "Excimer Annealing SLA3600" paper [previously filed Jun. 17, 1997 for this application].

James S. Im, et al., "Excimer Laser–Induced Crystallization of Thin Si Films for TFT Applications: Crystallized Microstructures and Responsible Transformation Mechanisms", AMLCDs, pp. 34–37.

M. Kamiya, et al., Excimer Laser Annealing SLA3600, pp. 24–25.

*Primary Examiner*—Peter Toby Brown
*Assistant Examiner*—Khanh Duong
*Attorney, Agent, or Firm*—Loeb & Loeb LLP

[57] ABSTRACT

Laser anneal processing of a semiconductor layer is repeated in a number of steps. Grain size is increased using high energy ELA for a first step, and grain sizes are uniformed using ELA with low energy for a later step. As a defective crystallization region occurs in an excessive energy region during the ELA for the first step, in the ELA for the second time, excessive energy is removed and the defective crystallization region is eliminated by reducing the energy to an optimal value, thereby improving the crystallinity of a p-Si layer.

14 Claims, 9 Drawing Sheets

LASER ANNEAL METHOD FOR A SEMICONDUCTOR DEVICE

BACKGROUND OF THE INVENTION

1. Field of the Invention

The present invention relates to a laser annealing method of, for example, crystallizing an amorphous semiconductor to obtain a polycrystal semiconductor film used for thin film transistors (TFT) formed in a display area and a driver circuit section in an LCD (liquid crystal display) apparatus.

2. Description of the Related Art

In recent years, LCDs have steadily been employed in OA and AV devices because of advantages in their small size and thickness and their low power consumption. In particular, an active matrix type, in which each pixel is equipped with a TFT as a switching element for controlling the rewrite timing of image data, realizes animation display with high resolution on a large screen, and is therefore used for displays in various televisions, personal computers, and the like.

A TFT is a FET (field effect transistor) obtained by forming a semiconductor layer together with a metal layer in a predetermined shape on an insulating substrate. In an active matrix type LCD, a TFT is connected to an electrode of each capacitor as a pixel for driving liquid crystal, formed between a pair of substrates.

In particular, developments have been made to an LCD using a polycrystal silicon (p-Si) as a semiconductor layer in place of amorphous silicon (a-Si) which had previously been common, and annealing with use of a laser beam has been put to use for formation or growth of crystal grains. In general, p-Si has a higher mobility than a-Si so that TFTs can be downsized and a high aperture ratio, by using p-Si to form TFTs, and a high resolution can be realized. In addition, since TFTs can be constructed in a gate self-alignment structure, fine TFT element is achieved and higher speed operation can be achieved by reductions in parasitic capacity. By using these TFTs to form an electric complementary connection structure between an n-ch TFT and a p-ch TFT, i.e., a CMOS, a high speed driver circuit can be constructed. Therefore, a driver circuit section can be formed to be integral with a display area on one same substrate, so that manufacturing costs can be reduced and the LCD module realizes a small size.

As a method of forming a p-Si layer on an insulating substrate, there is a crystallization method by annealing a-Si formed under a low temperature or a solid phase crystallization (SPC) method under a high temperature. In many cases, the treatment must be carried out under a high temperature of 900° C. or more. Therefore, it is not possible to use a low cost non-alkaline glass substrate in view of heat resistance, but a costly quartz glass substrate is required, resulting in a higher manufacturing cost. In contrast, developments have been made to a method which allows use of a non-alkaline glass substrate as an insulating substrate by performing silicon polycrystallization processing at a relatively low temperature of 600° C. or less, with use of laser annealing. The process, in which the processing temperature is 600° C. or less throughout all TFT manufacturing steps is called "low-temperature process", and is necessary for mass-production of LCDs at low cost.

Figure 1:
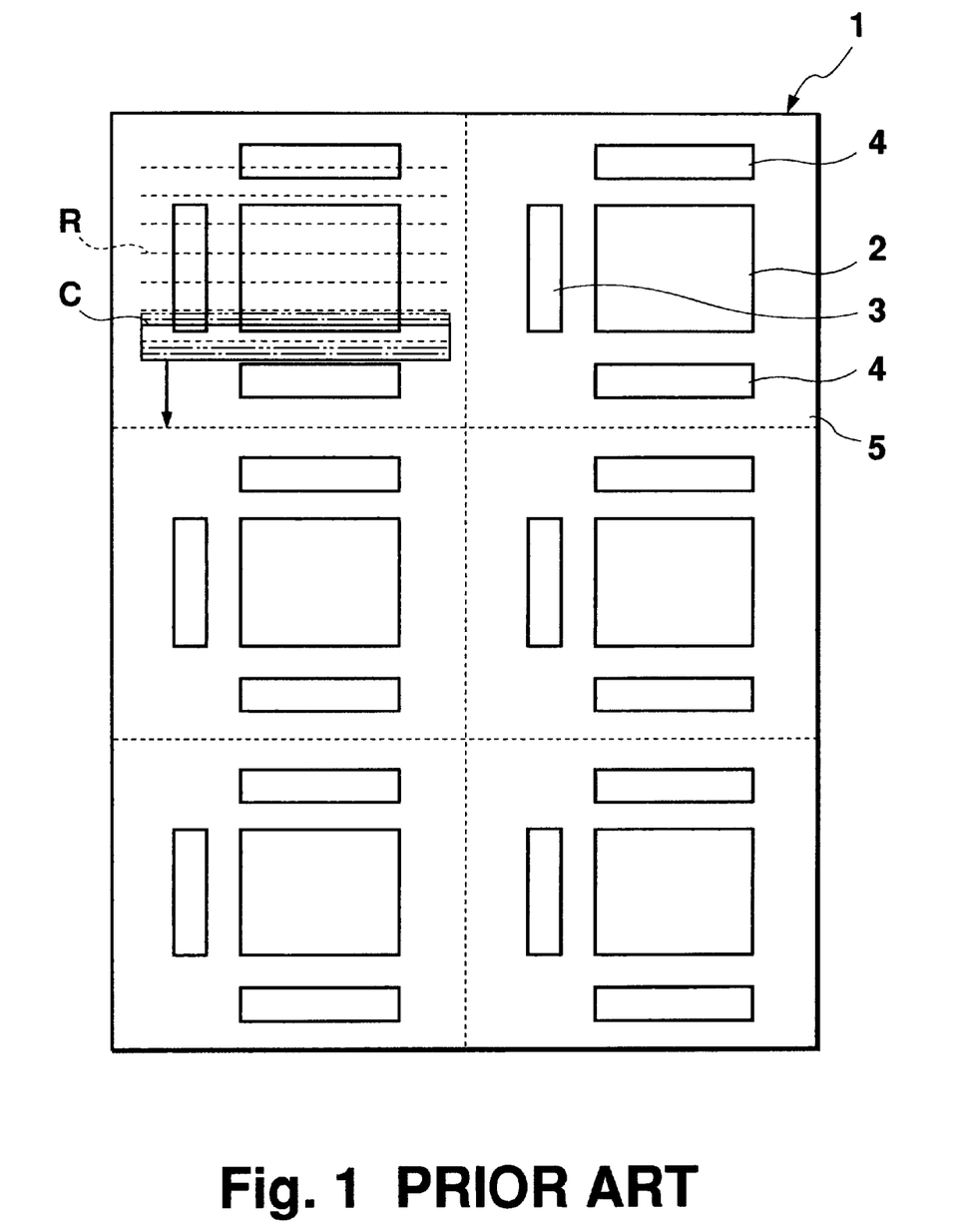
FIG. 1 is a view explaining a conventional relationship between a substrate to be processed and an irradiation region of a line beam.

FIG. 1 shows a state of substrate to be processed by excimer laser annealing processing (hereafter referred to as ELA). A substrate 1 to be processed is a popular non-alkaline glass substrate. An a-Si layer is formed on the surface of the substrate 1. An active matrix substrate 5 is a substrate constructing an LCD comprising a display area 2 where display pixels are arranged in matrix, and a gate driver 3 and a drain driver 4 provided in the periphery of the display area 2. The substrate 1 is a mother glass substrate including six active matrix substrates 5. In the display area 2, pixel electrodes, each being an electrode of a pixel capacitor for driving liquid crystal are formed and arranged in matrix, and are respectively connected with TFTs formed. A gate driver 3 is mainly constructed by a shift register, and a drain driver 4 is mainly constructed by a shift register and a sampling circuit. These drivers are formed by a TFT array such as a CMOS or the like. Each TFT is formed in a manner in which p-Si crystallized from a-Si by ELA is used as an operation layer.

As shown in FIG. 1, in a conventional laser annealing method, a line beam is irradiated on a substrate 1 such that the contour of edge lines C of a band-like irradiation region on the substrate 1 is shifted by a predetermined overlap amount. Scanning is carried out as indicated by arrows, and the entire substrate is subjected to annealing. However, after scanning is thus performed with a line beam, there remains a defective crystallization region in which sufficient crystallization was not attained and grains remain with a smaller grain size, as indicated by reference R in the figure, in p-Si formed. This region is formed in a linear shape along the longitudinal direction of the irradiation region, and appears to be a striped pattern. Since this defective crystallization region R has a low mobility and a high resistance, the characteristics of TFTs formed in this region are degraded. If the characteristics of TFTs are thus degraded, pixel capacitors are not sufficiently charged in the display area so that the contrast ratio is lowered or erroneous operation is caused in the peripheral driver circuit section, thus making disadvantageous influences on display.

It is estimated that a defective crystallization region as described above is caused because of unevenness in energy of an irradiated laser beam. Laser annealing strongly depends on the energy of the irradiated laser beam. In general, the grain size of crystalline tends to increase as the irradiation energy increases. However, when the energy level increases to a certain level Eu or more, the grain size rapidly decreases. Hence, it is demanded that the energy level of a laser beam to be irradiated onto an a-Si layer should be as large as possible within a range of Eu to Ed which is lower than an upper limit level Eu such that the energy level does not exceed the upper limit Eu, in order to enlarge the grain size as much as possible thereby to achieve TFTs having excellent characteristics.

Figure 2:
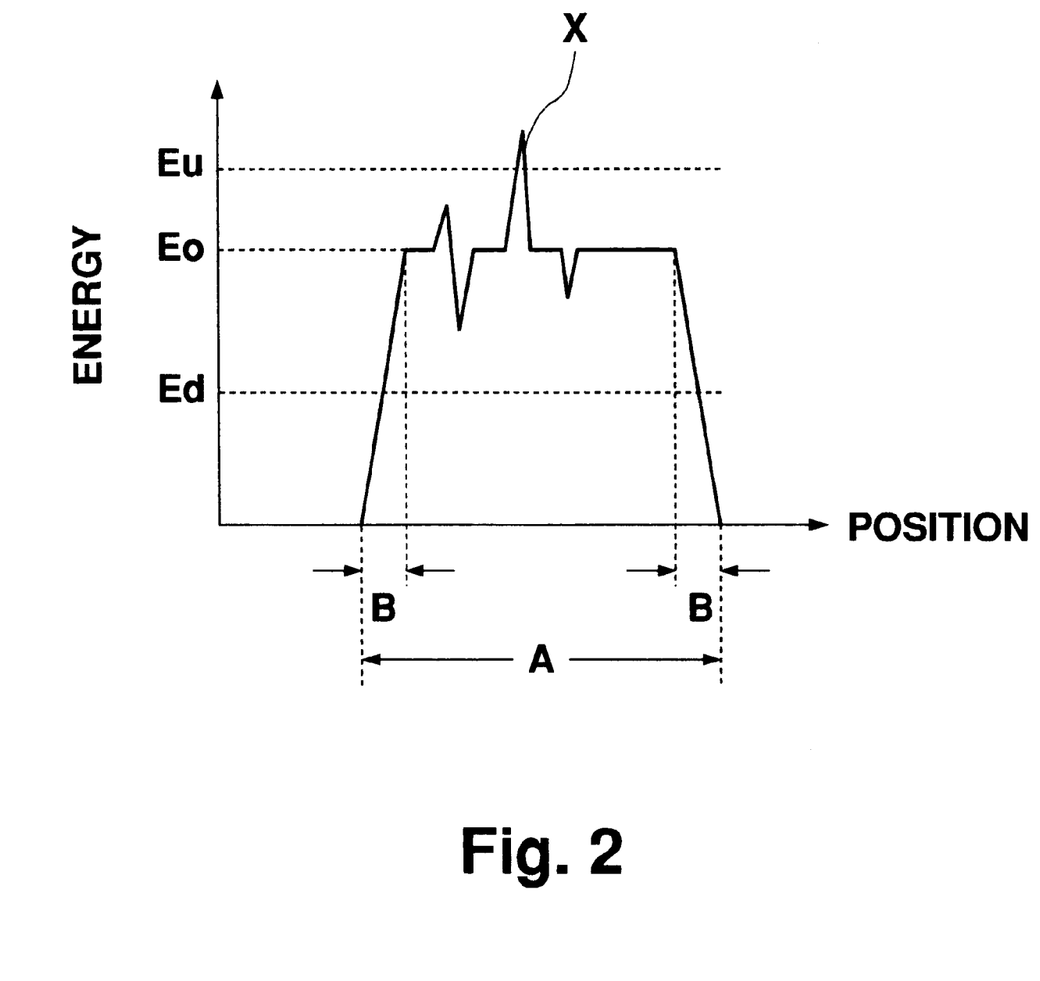
FIG. 2 is a graph showing an energy distribution of an irradiation laser beam.

FIG. 2 shows an energy distribution of an irradiation beam with respect to positions in a line beam. An optical system for generating a line beam is provided with a line width adjust slit and a line length adjust slit, to form a line beam of a band-like or rectangular shape. Thus, since the line width A of a line beam is defined by the line width adjust slit, the characteristic curve of the irradiation light intensity distribution has substantially sharp edges and a substantially flat energy distribution peak portion Eo, as shown in FIG. 2. However, in regions X and B in FIG. 2, the energy level is extremely high or low and is thus greatly different from the level in the flat portion.

In an optical system comprising a plurality of lenses, light is diffracted or interfered due to slight concave and convex portions existing in the lens surfaces and foreign material contamination or the like sticking thereto. The light thus diffracted or interfered is converged in the line width direction A and is expanded in the line length direction, so that ununiformity of energy of the laser beam irradiated toward the substrate 1 from the optical system is serious. Even if only a slight amount of foreign material or the like exists in a clean room, it may cause unevenness in light intensity and greatly influence energy distribution. Therefore, ununiformity of the output energy of a line beam cannot be completely eliminated at present, and it is unavoidable that the energy level of a line beam to be irradiated partially exceeds the upper limit which allows an appropriate grain size.

As a result of this, a line beam whose energy level is uneven is intermittently irradiated as shown in FIG. 2, and a laser beam which partially exceeds the upper limit Eu of the energy level is irradiated within a unit irradiation region having edge lines C as shown in FIG. 1. For these reasons it is considered that a much finer linear defective crystallization region R is caused within the edge lines C.

BRIEF SUMMARY OF THE INVENTION

The present invention has an object of providing a method of obtaining a semiconductor layer with excellent characteristics by means of laser anneal processing, by preventing ununiformity in characteristics of a semiconductor layer.

To achieve the above object, the present invention provides a laser anneal method of subjecting a semiconductor layer on a substrate to laser anneal processing, to thereby improve a characteristic of the semiconductor layer, wherein laser anneal processing is performed on one same semiconductor layer in a plurality of steps, a laser energy is set to be higher in the laser anneal processing for an earlier step, and the laser energy is set to be lower in the laser anneal processing for a later step.

More specifically, the laser energy in the laser anneal processing for the later step is set to be lower than the laser energy in the laser anneal processing for the earlier step.

At first, laser annealing is carried out with a high energy, and thereafter, laser annealing is carried out with the energy gradually reduced. As a result, it is possible to achieve annealing with an optimal energy for crystallization or activation. Specifically, sufficient crystallization or activation is aimed by setting the energy to be as high as possible in the annealing for the first time, while the film quality in part may be simultaneously degraded due to an excessive energy. Subsequently, by performing annealing with the energy gradually reduced, crystallization or activation of a portion where the layer quality is degraded is achieved while maintaining portions where sufficient crystallization or activation has already been attained. Thus, excellent annealing is achieved for the entire region.

Further, the present invention provides a laser anneal method for subjecting an amorphous semiconductor layer on a substrate to laser anneal processing, to form a polycrystal semiconductor layer, wherein laser anneal processing is performed on one same semiconductor layer in a plurality of steps, a laser energy is set to be higher in the laser anneal processing for an earlier step, and the laser energy is set to be lower for a later step.

Particularly, in the laser anneal method described above, the laser energy in the laser anneal processing for the later step is set to be lower than the laser energy in the laser anneal processing for the earlier step.

By the earlier laser annealing with a relatively high energy, an amorphous semiconductor layer is crystallized to form a polycrystal semiconductor layer consisting of sufficiently large crystal grains. Subsequently, through the later annealing with a relatively low energy, a defective crystallization region remaining after the earlier laser annealing is subjected to crystallization, so that a polycrystal semiconductor layer is obtained with excellent crystallinity.

The laser anneal processing described above is performed by shaping a laser beam generated from a laser oscillation source by an optical system including a plurality of lenses, such that a region to be irradiated by the laser beam has a predetermined shape, irradiating the laser beam emitted from the optical system onto the amorphous semiconductor layer, and scanning the amorphous semiconductor layer in a predetermined direction with the laser beam.

A laser beam with a large energy generated from an oscillation source is shaped by a predetermined optical system and is irradiated onto a large area, thereby to realize annealing with a high throughput. In particular, a defective crystallization region caused by an ununiformity in irradiation beam energy resulting from convergence and/or diffusion of light effected when shaping a laser beam is subjected to crystallization and is eliminated, by later laser annealing with a relatively low energy. Specifically, the energy is set with priority given to an increase in grain size of crystal grains, while the energy is set with priority given to uniformity in grain size of crystal grains. In this manner, the grain size of the crystal grains are increased and made uniform.

Further, in order to obtain a polycrystal semiconductor layer with higher uniformity, average energy levels of laser beams irradiated onto an object to processed in the laser anneal processing are set within a range of an energy required for making crystal, formed in the polycrystal semiconductor layer, to have a desired grain size, and a set average level of the laser energy in the laser anneal processing for the later time is set such that an energy peak level on a surface irradiated with the laser beam is equal to or lower than an upper limit of a range of an energy required for making crystal in the polycrystal semiconductor layer to have a desired grain size.

Further, the laser energy in the laser anneal processing for the earlier step is set such that a set average level of the laser energy is in the vicinity of an energy level required for making crystal in the polycrystal semiconductor layer to have a maximum grain size, and a set average level of the laser energy for the later step is set such that an energy peak level on a surface irradiated with the laser beam is equal to or lower than an upper limit of a range of an energy required for making crystal in the polycrystal semiconductor layer to have a desired grain size.

By thus controlling the energy level of the laser beam, it is possible to increase the grain size of crystal grains in the laser anneal processing in the earlier step and to uniform the grain size of crystal grains in the laser anneal processing in the later step. Therefore, it is possible to form a polycrystal semiconductor layer whose crystal grains has a large and uniform grain size over the entire region of the substrate.

In addition, according to another aspect of the present invention, a polycrystal semiconductor layer is formed by subjecting an amorphous semiconductor layer on a substrate to laser anneal processing, wherein one same amorphous semiconductor layer is subjected to the laser anneal processing in a plurality of steps, a laser energy of a laser beam irradiated onto the amorphous semiconductor layer in the laser anneal processing in a later step is set to be lower than a laser energy of a laser beam irradiated onto the amorphous semiconductor layer in the laser anneal processing in an earlier step, and the amorphous semiconductor layer is polycrystallized by the laser anneal processing and the polycrystal semiconductor layer obtained is used as an active layer of the transistor layer.

By thus controlling the laser energy to form a polycrystal semiconductor layer and by using the layer as an active layer of a transistor element, it is possible to obtain a transistor element with a high speed and excellent characteristics. Further, since a polycrystal semiconductor layer having excellent characteristics is obtained, it is possible to form a transistor element having a gate-self-align structure. If this kind of transistor is used as a switching element of a display area and as a switching element of a driver circuit section for driving the switching element of the display area in a liquid crystal display apparatus or the like, it is possible to form a display apparatus with excellent display quality.

DETAILED DESCRIPTION OF THE INVENTION

Figure 3:
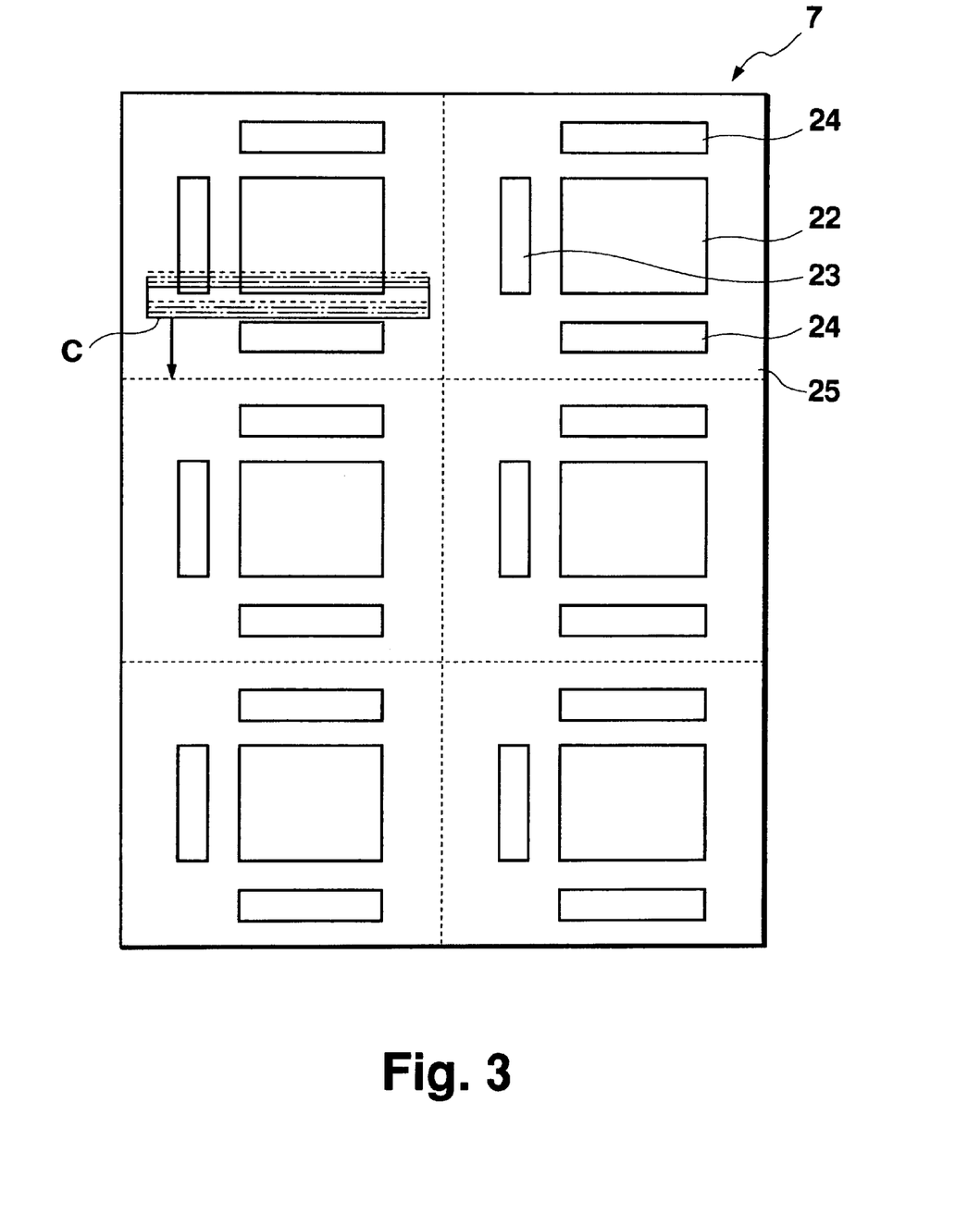
FIG. 3 is a view explaining a positional relationship between a substrate to be processed and an irradiation region according to the present invention.

FIG. 3 shows a positional relationship between a substrate 7 to be processed and a line beam when ELA is performed according to an embodiment of the present invention. The substrate 7 to be processed is a popular non-alkaline glass substrate, and an a-Si layer is formed on the surface of the glass substrate. An active matrix substrate 25 forms one substrate of an LCD comprising a display area 22 where display pixels are formed and arranged in matrix, and gate and drain drivers 23 and 24 formed and arranged in the periphery of the display area 22. The substrate 7 is a mother glass substrate including six active matrix substrates 25. In the display area 22, pixel electrodes, each being an electrode of a pixel capacitor for driving liquid crystal, are arranged in matrix and TFTs are formed to be connected respectively with the pixel electrodes. The gate driver 23 is mainly constructed by a shift register, and the drain driver 24 is mainly constructed by a shift register and a sampling hold circuit. These drivers are constituted by a TFT array such as a CMOS or the like, and each TFT is formed with use of p-Si formed by the ELA method according to the present invention, as an operation layer.

In an embodiment of the present invention, ELA is performed by irradiating a line beam obtained from a laser irradiation apparatus as will be described later onto a substrate 7 as a substrate to be processed, to scan the substrate with the beam. An excimer laser is a pulse laser, and a line beam of the pulse laser is intermittently irradiated onto the substrate 7 to be processed such that the substrate 7 is scanned in the direction indicated by an arrow in FIG. 3, with the line beam. Further, the line beam is controlled such that irradiation regions of any successive pulse beams overlap each other by a predetermined amount. (See edge lines C in the figure.) The entire surface of an amorphous semiconductor layer on the substrate 7 is annealed by scanning the substrate 7 while thus sequentially shifting the position of the line beam to be irradiated.

A line beam generated by a laser irradiation apparatus to be described later has an approximate line length of 80 to 300 mm and a line width of 0.1 to several mm.

Scanning is performed such that the line beam is moved as described above in the line width direction on the substrate 7, and this scanning is carried out for each active matrix substrates 25 arranged in a plurality of columns (e.g., in two columns in FIG. 3) on the substrate 7 to be processed as a mother substrate. In this manner, annealing is performed once on the entire surface of the substrate 7 to be processed.

In the present invention, ELA as described above is performed on one same a-Si layer as a target to be processed on the substrate 7 in a plurality of steps, e.g., twice. Further, in ELA for an earlier step, the laser energy Ea of a laser beam to be irradiated onto the a-Si layer is set to be large. In ELA for the later times of the plurality of times, the laser energy Eb of the laser beam to be irradiated onto the a-Si layer is set to be smaller than the laser energy Ea. This characterizes the present invention.

Figure 4:
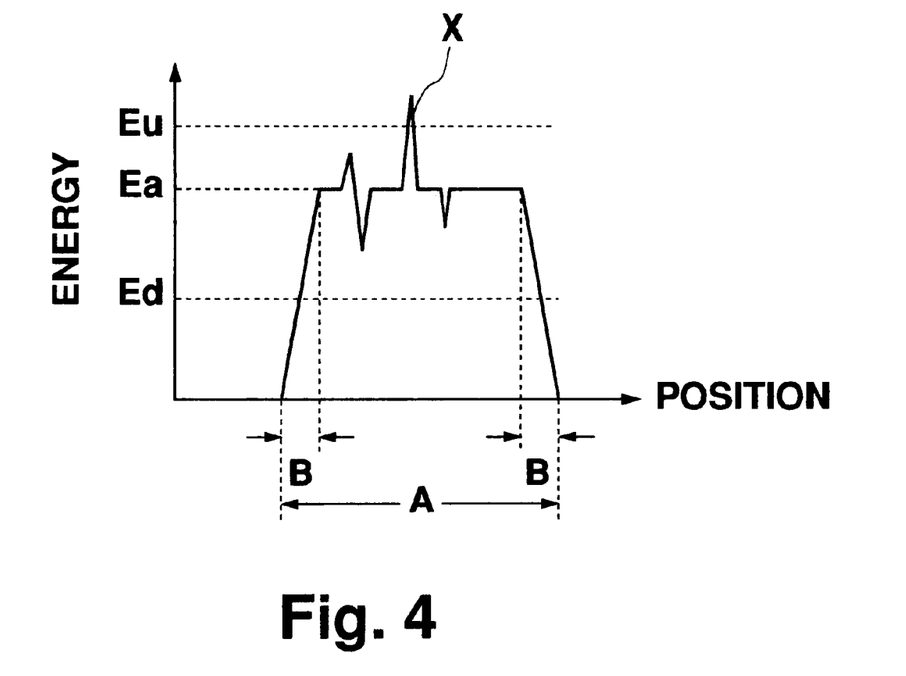
FIG. 4 is a graph showing an energy distribution of a line beam irradiated formerly, according to an embodiment of the present invention.
Figure 5:
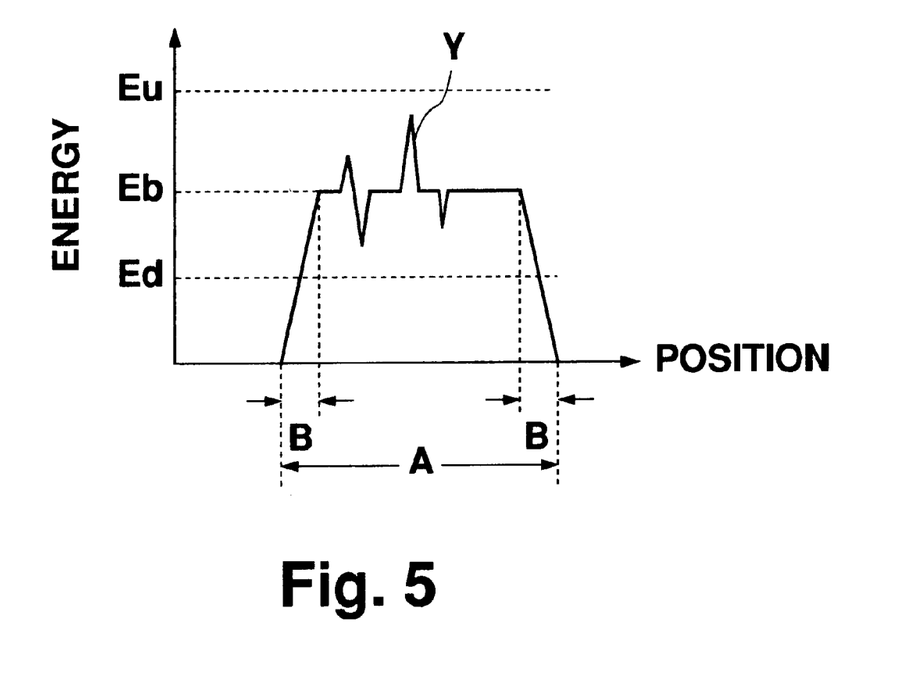
FIG. 5 is a graph showing an energy distribution of a line beam irradiated latterly, according to an embodiment of the present invention.
Figure 6:
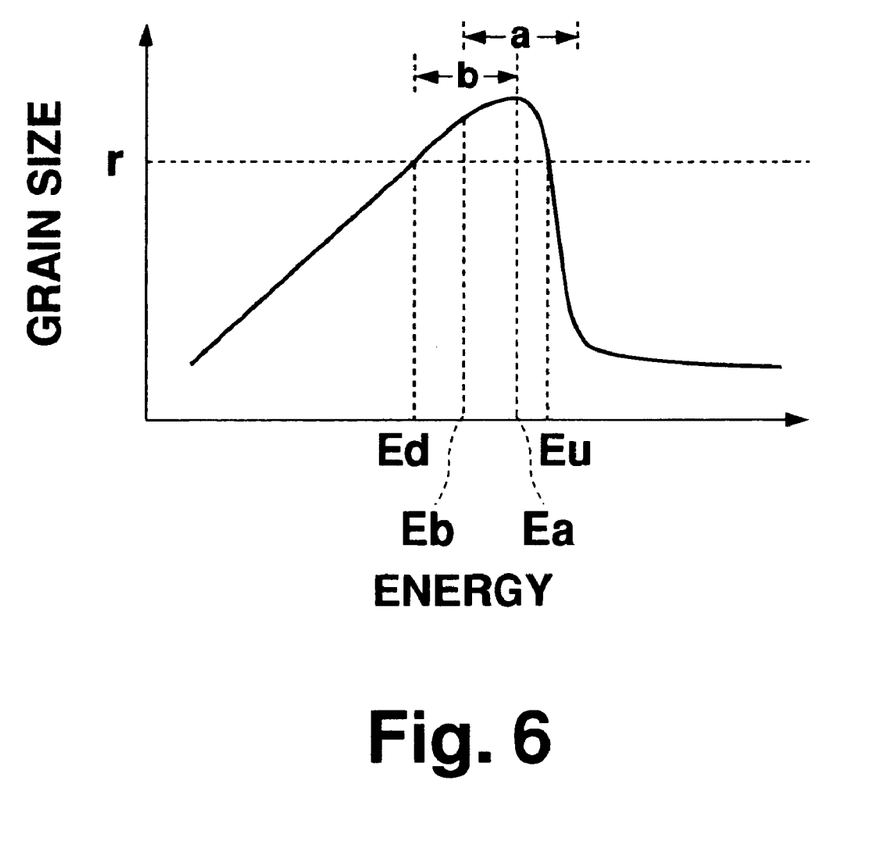
FIG. 6 is a graph showing a relationship between energy and grain size in ELA.

FIG. 4 shows a profile between the position of a line beam in the line width direction and the irradiation laser energy, with respect to the energy of the line beam in the annealing processing for the earlier step. FIG. 5 shows a profile between the position of a line beam in the line width direction and the irradiation laser energy, with respect to the energy of the line beam in the annealing processing for the later step. FIG. 6 shows a relationship between laser energy and grain size. From FIG. 6, it is apparent that the grain size increases as irradiated laser energy increases and the grain size rapidly decreases when the energy exceeds a certain value (Eu in this case). Specifically, when the irradiated energy level exceeds the energy Ea which maximizes the grain size, the grain size decreases again. When the energy of the irradiated laser exceeds the energy Eu, the grain size rapidly decreases. Therefore, in order that crystalline grows to have a desired grain size of [r] or more by laser annealing, the laser energy only may be controlled within a range of Ed to Eu and must be controlled so.

In the present invention, as shown in FIG. 4, the laser energy in the annealing for an earlier time is regarded as a flat level of the energy of the line beam, i.e., the set level is regarded as a high energy level Ea, viewed from the set average level. However, since the line beam irradiated has an ununiformity in energy distribution, a peak portion as indicated by X appears at a partial region of the line beam where the set average level is Ea. Further, since the set average level is set to a high value, there is a case in which the peak portion X exceeds the upper limit Eu of the energy which allows an optimal grain size [r] to be obtained. In this case, the grain size is small in that region of the irradiation region of he line beam, in which the energy level exceeds the upper limit Eu, and that region remains as a defective crystallization region.

However, in the present invention, ELA is carried out in a plurality of steps and, in annealing processing for a later step, the energy level of the laser beam is set to a level Eb which is lower than the energy Ea in the annealing processing for an earlier time, within the range of Eu to Ed. Specifically, as shown in FIG. 5, the flat level of the laser energy in the annealing processing for a later step, i.e., the set average level, is an energy level Eb which is lower than Ea. With respect to the laser beam used in the annealing processing for a later time, the irradiated energy has an ununiformity like in the annealing processing for an earlier time, and a peak portion Y having a considerably high level occurs. However, since the set average level Eb is sufficiently low, the level of the peak portion Y does not exceeds the threshold value Eu as the upper limit of the energy.

Figure 7:
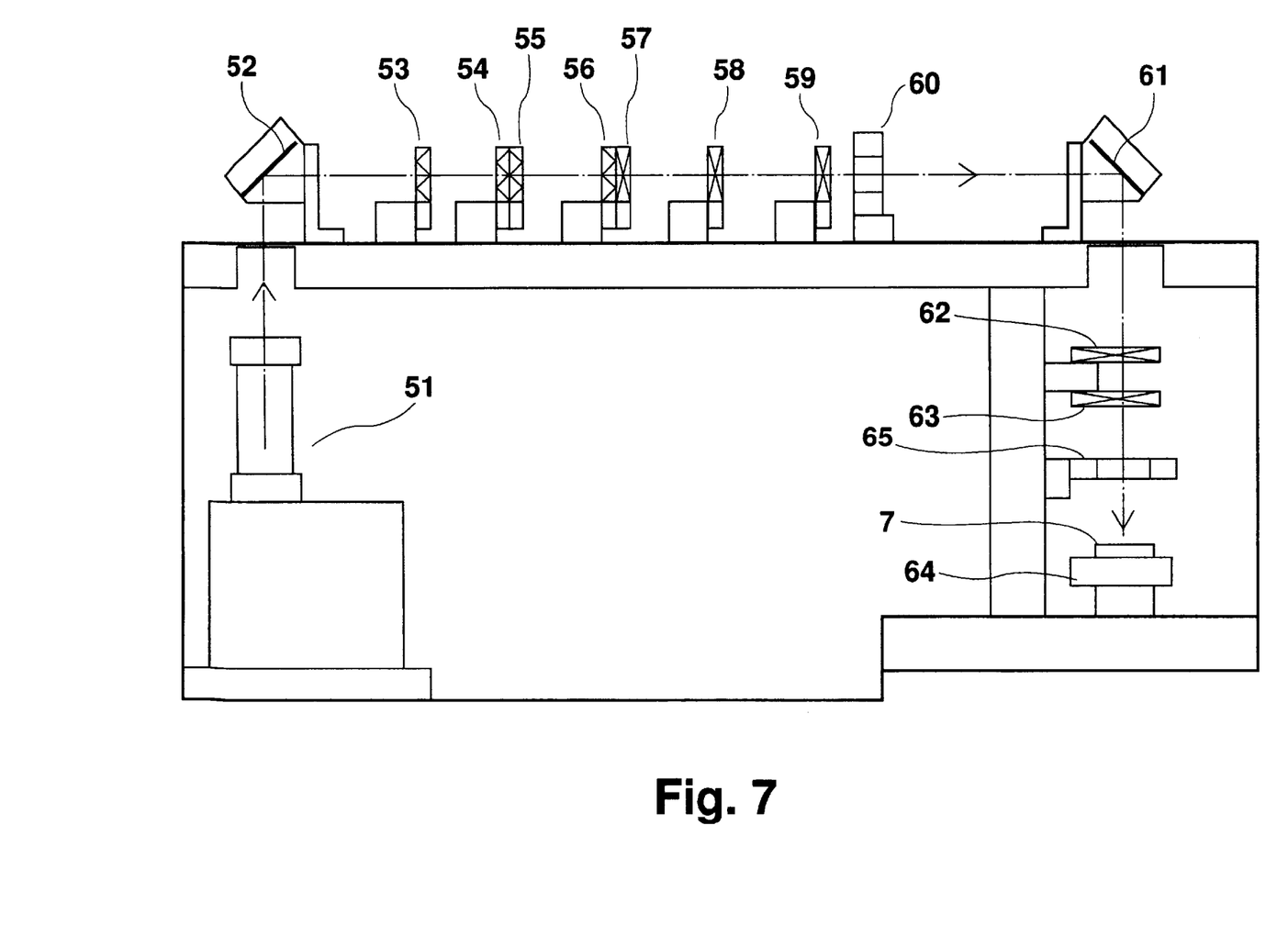
FIG. 7 is a schematic view of the structure of a laser irradiation apparatus used in an embodiment of the present invention.
Figure 8:
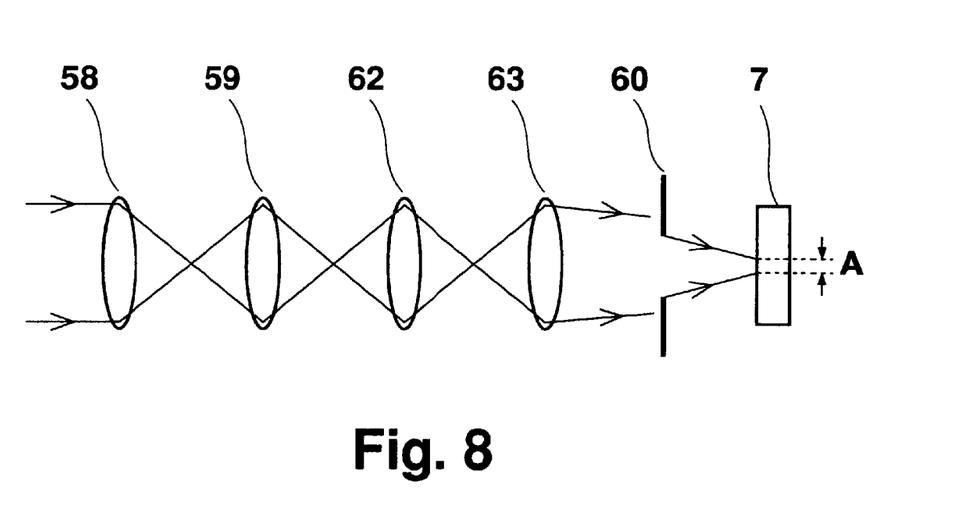
FIGS. 8 and 9 are views explaining the structure of an optical system of a laser irradiation apparatus shown in FIG. 7.
Figure 9:
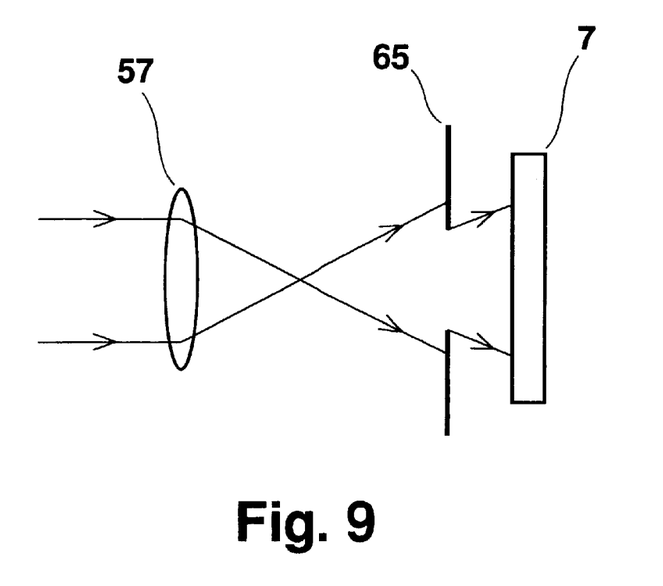

The structure of the above laser irradiation device for performing laser annealing will next be explained with reference to FIG. 7.

In this figure, a reference 51 denotes a laser oscillation source. References 52 and 61 denote mirrors. References 53, 54, 55, and 56 denote cylindrical lenses. References 57, 58, 59, 62, and 63 denote convergence lenses. A reference 60 denotes a slit, and a reference 65 denotes a slit extending in the line length. A reference 64 denotes a stage for supporting a substrate 7 to be processed which has a surface where a-Si is formed and is provided close to the stage 64.

Laser light is a pulse wave, here, an excimer laser. Laser light irradiated from the laser oscillation source 51 is shaped by two pairs of condenser lenses consisting of a pair of cylindrical lenses 53 and 55 and a pair of cylindrical lenses 54 and 56, into parallel light whose intensity has a flat output distribution in the longitudinal and lateral directions. This parallel light is converged in one direction by lenses 58, 59, 62, and 63, and is expanded in another direction by a lens 57, to create a band-like or rectangular beam and that is irradiated on the substrate 7 to be processed. A slit 60 for adjusting the line width and a slit 65 for adjusting the line length respectively shield both end portions in the line width direction [A], and in the line length direction, to clearly define the shape to be irradiated, thus generating a line beam of a width A while constantly maintaining the intensity in the effective irradiation region.

The stage 64 where the substrate 7 is mounted is arranged to be movable in the X- and Y-directions. With use of this kind of apparatus, the annealing processing as described above can be carried out with a high throughput for a substrate of a large area, even when annealing processing is carried out in a plurality of steps.

In addition, the laser irradiation apparatus as described above is capable of generating line beams of various set levels including Ea and Eb, toward a substrate 7 to be processed, so that the substrate 7 is scanned with a line beam having an energy profile corresponding to the set average level. Note that if even a slight diffraction or interference occurs in an optical system including a plurality of lenses and diffracted or interfered light is converged in the width direction of the line beam and is expanded in the line length direction of the line beam, the irradiation energy causes an ununiformity as shown in FIGS. 4 and 5, so that peak portions X and Y having a higher level than the flat portion (or set average level) occur or an edge region B of the line beam has an inclination different from a right angle due to vague contour.

As has been explained above, according to the present invention, annealing for the first time is carried out with an energy Ea. In this annealing, although a p-Si layer containing the largest grains all of which have a grain size of [r] or more is formed over the entire area of the substrate, the irradiation energy has an ununiformity as described above, so that the irradiation energy changes within a range denoted by [a] in FIG. 6 and partially exceeds the energy Eu as an upper limit of the energy range in which an excellent grain size is obtained. Specifically, a portion as denoted by X in FIG. 4 occurs at a higher probability, and the grain size is not sufficiently large in the region corresponding to the portion X where the irradiation energy is considerably high, resulting in a defective crystallization region R as indicated by a broken line in FIG. 1.

Subsequently, annealing for the second time is carried out with an energy Eb. In this annealing, the irradiation energy changes within a range denoted by b in FIG. 6, and does not exceed the energy Eu as a threshold value over which the grain size rapidly decreases. Specifically, as shown in FIG. 5, although the irradiation energy has an ununiformity, the irradiation energy doe not exceed the energy Eu as a threshold value to which a grain size r is obtained, even at a peak portion of energy denoted by Y since the set average level of the energy is lowered. Therefore, in this later ELA, no defective crystallization portion occurs, but the grains formed in the annealing for the first time remain without changes, and the defective crystallization region R caused by the annealing for the first time is subjected to crystallization. Consequently, crystallinity is improved.

Figure 10:
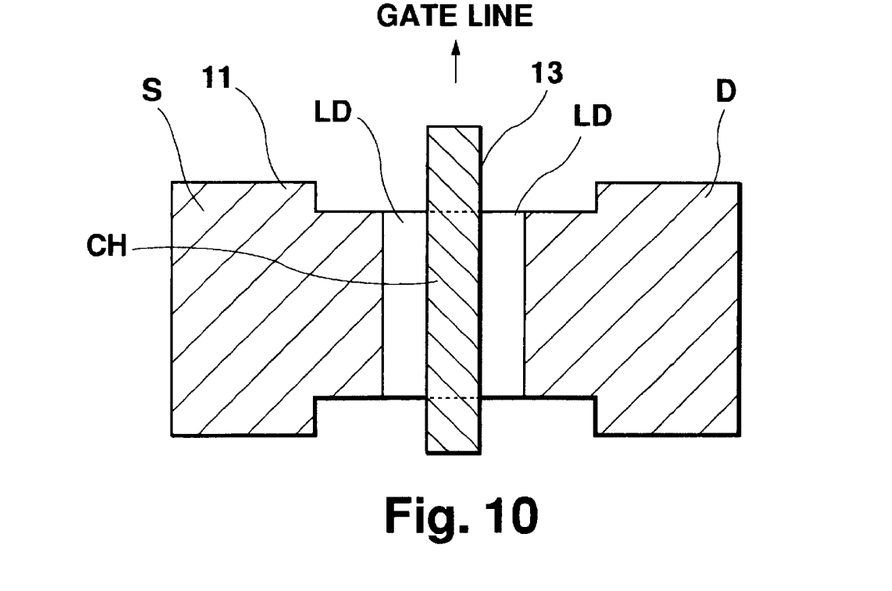
FIG. 10 is a plane view showing a TFT according to an embodiment of the present invention.

FIG. 10 shows a TFT formed on the substrate 7 to be processed shown in FIG. 3 according to the present invention. A p-Si layer formed by the ELA method according to the present invention is etched into an island-like shape. In the p-Si 11 thus formed, a non-doped channel region CH, light-doped regions LD, and heavy-doped source and drain regions S and D are formed in an island-like p-Si layer 11. On the channel region CH, a gate electrode 13 is formed with a gate insulating film inserted between the channel region and gate electrode 13.

Figure 11:
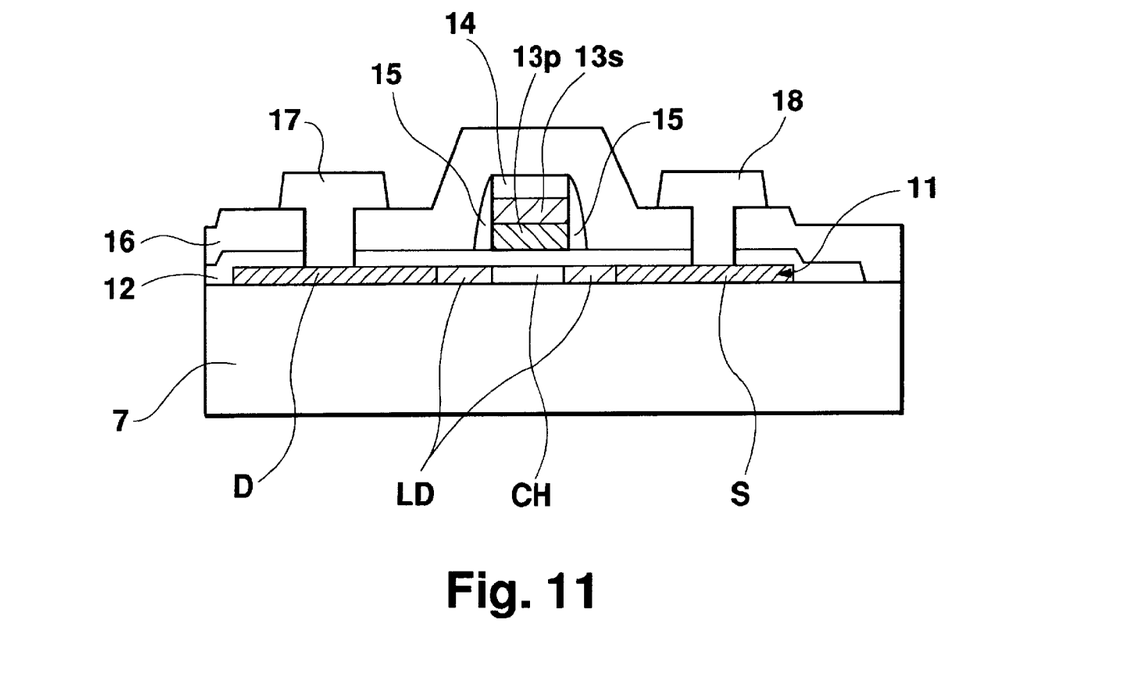
FIG. 11 is a view schematically showing a cross-section of the structure of the TFT shown in FIG. 10.

FIG. 11 shows an example of a cross-section where a TFT is completed. A p-Si layer 11 is formed in an island-like shape on a non-alkaline glass substrate 7 as a substrate to be processed, a non-doped channel region CH is formed in the p-Si layer 11, and regions LD are formed in both sides of a non-doped channel region CH. Source and drain regions S and D are formed outside the regions LD. A gate insulating film 12 covers the p-Si layer 11, and a gate electrode 13 consisting of a doped p-Si layer 13p, tungsten silicide 13s, and the like is formed at a region corresponding to the channel region CH. An implantation stopper 14 for preventing counter-doping when implantating ions of a different conductive type in the CMOS structure is formed on the gate electrode 13. On the side walls of the gate electrode 13, side walls 15 are formed to previously prepare margins so that the regions LD might not be enhanced over the edges of the gate electrode 13 when impurities implantated into the p-Si layer 11 are diffused in the lateral direction by activation annealing. A first inter-layer insulating film 16 is formed so as to cover the entire surface of the substrate 7, and drain and source electrodes 17 and 18 made of low-resistance metal are formed on the first inter-layer insulating film 16 and are respectively connected with drain and source regions D and S through contact holes formed in the gate insulating film 12 and the inter-layer insulating film 16.

If a TFT as shown in FIG. 11 is used and constructed in a CMOS structure and is used as a driver circuit section (including a gate driver 23 and a drain driver 24) for an LCD as shown in FIG. 3, it is possible to simultaneously form a driver circuit with high performance and high speed in manufacturing steps substantially equal to those for a TFT for driving liquid crystal.

Figure 12:
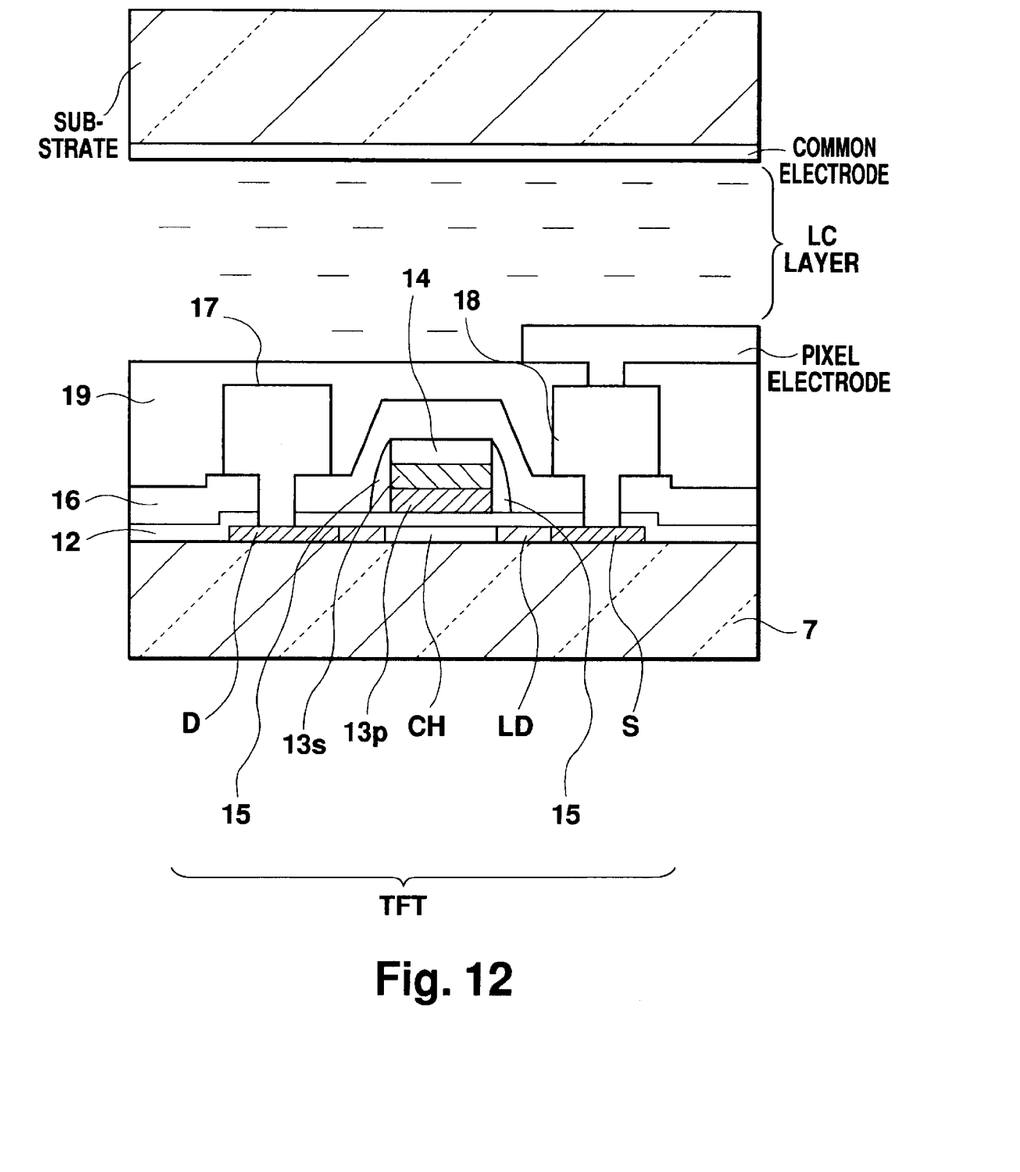
FIG. 12 is a view schematically showing a cross-section of the structure of a display area in a liquid crystal display apparatus using a TFT according to an embodiment of the present invention.

Further, in the display area 22 of the LCD shown in FIG. 3, a second inter-layer insulating film 19 having a flattening effect is formed on the entire surface so as to cover the drain electrode 17 and the source electrode 18 formed as shown in FIG. 12. In addition, a pixel electrode for driving liquid crystal is formed on the second inter-layer insulating film 19 and is connected with the source electrode 18 through a contact hole formed above the source electrode 18.

In case of forming a liquid crystal display device, another substrate is provided so as to face the substrate 7 on which TFTs and pixel electrodes connected thereto are formed. A liquid crystal layer is formed between the substrates. A common electrode coupled with a pixel electrode to constitute a liquid crystal drive capacitor is formed on the substrate facing the substrate 7.

As has been described above, since a TFT is used, for example, as a driver circuit section for an LCD or as a switching element for the display area 22, it is desired that the grain size of p-Si used for an operation layer of a TFT should be as large as possible. However, the relationship between laser energy and grain size is characterized in that the grain size rapidly decreases when the laser energy exceeds a value which provides the largest grain size while the laser energy is increased. If the laser energy is increased as much as possible in order to obtain a large grain size, the irradiation energy exceeds the threshold value over which the grain size rapidly decreases at some portions due to an ununiformity in irradiation energy, and regions corresponding to those portions remain as defective crystallization regions. Particularly, as shown in FIG. 6, the inclination of the characteristic curve representing a relationship between laser energy and grain size is greater in the high energy side of Eu than in the low energy side of Ed, with respect to the threshold energy which provides the grain size r. The grain size rapidly decreases even when the energy only slightly exceeds the energy Eu.

If a defective crystallization region thus generated falls within a TFT region, especially, in a channel region CH forming an active layer of a TFT or a region LD of a LDDTFT (lightly doped drain TFT), there occurs a problem that the characteristic of the TFT is degraded. In the present invention, this problem is solved by performing annealing with relatively high energy to obtain a large grain size and by thereafter performing annealing with relatively low energy to uniform grain sizes. Specifically, grains have a sufficiently large grain size by earlier annealing and a defective crystallization region is subjected to crystallization by the later annealing with the grains formed with a large being maintained. Crystallinity is thus improved.

The present invention is not limited to the above embodiment. For example, excellent laser annealing can be achieved if laser annealing is carried out in three or more steps, even a large number of steps, while gradually reducing the energy for each step. Specifically, if the number of steps for which laser annealing is carried out is increased, the width by which the set value of the laser energy is reduced for each step can be reduced. Accordingly, laser energy can be changed more loosely from the annealing for the first step, in which priority is given to an increase in crystalline grain size, to the annealing for the last step in which priority is given to uniformity of grain sizes, so that annealing can be performed with much more preferable energy levels.

In addition, application of the present invention is not limited to a TFTLCD. The present invention is applicable to manufacture of all semiconductor devices which relate to polycrystallization of an amorphous semiconductor thin film, including a solar battery and the like.

Further, the present invention is not limited to crystallization annealing. For example, the present invention is applicable to activation processing for a doping layer doped with impurities in a TFTLCD or an LSI.

We claim:

1. A laser anneal method for subjecting a semiconductor layer on a substrate to laser anneal processing, thereby changing a characteristic of the semiconductor layer, wherein laser anneal processing is performed on one same semiconductor layer in a plurality of steps, the plurality of steps comprising at least two independent passes;

a laser energy is set to be high in the laser anneal processing for an earlier one of the plurality of steps, and the laser energy is set to be low in the laser anneal processing for a later one of the plurality of steps.

2. A laser anneal method according to claim 1, wherein the laser energy in the laser anneal processing for a later of the plurality of steps is set to be lower than the laser energy in the laser anneal processing for an earlier step.

3. A laser anneal method for subjecting an amorphous semiconductor layer on a substrate to laser anneal processing, to form a polycrystal semiconductor layer, wherein laser anneal processing is performed on one same semiconductor in a plurality of steps, the plurality of steps comprising at least two independent passes;

a laser energy is set to be high in the laser anneal processing for an earlier one of the plurality of steps, and the laser energy is set to be low in the laser anneal processing for a later one of the plurality of steps.

4. A laser anneal method according to claim 3, wherein the laser energy in the laser anneal processing for a later of the plurality of steps is set to be lower than the laser energy in the laser anneal processing for an earlier step.

5. A laser anneal method according to claim 4, wherein set average levels of laser energies of laser beams irradiated onto an object to be processed in the laser anneal processing in the plurality of steps are set within a range of an energy required for making crystal, formed in the polycrystal semiconductor layer, to have a desired grain size, and a set average level of the laser energy in the laser anneal processing for a later step is set such that an energy peak level on a surface irradiated with the laser beam is equal to or lower than an upper limit of a range of an energy required for making crystal in the polycrystal semiconductor layer to have a desired grain size.

6. A laser anneal method according to claim 4, wherein set average levels of laser energies of laser beams irradiated onto an object to be processed in the laser anneal processing for the plurality of steps are set commonly within a range of an energy required for making crystal, formed in the polycrystal semiconductor layer, to have a desired grain size, the laser energy in the laser anneal processing for an earlier step is set such that a set average level of the laser energy is in the vicinity of an energy level required for making crystal in the polycrystal semiconductor layer to have a maximum grain size, and a set average level of the laser energy in the laser anneal processing for a later step is set such that an energy peak level on a surface irradiated with the laser beam is equal to or lower than an upper limit of a range of an energy required for making crystal in the polycrystal semiconductor layer to have a desired grain size.

7. A laser anneal method according to claim 3, wherein the laser anneal processing comprises the steps of:

shaping a laser beam generated from a laser oscillation source by an optical system including a plurality of lenses, such that a region to be irradiated by the laser beam has a predetermined shape;

irradiating the laser beam emitted from the optical system onto the amorphous semiconductor layer; and scanning the amorphous semiconductor layer in a predetermined direction with the laser beam.

8. A laser anneal method for subjecting a semiconductor layer on a substrate to laser anneal processing, thereby changing a characteristic of the semiconductor layer, wherein laser anneal processing is performed on one same semiconductor layer in a plurality of steps, the plurality of steps comprising at least two independent passes; and a laser energy is set to be lower for a later annealing processing of said plurality of steps than the laser energy for an earlier annealing processing.

9. A laser anneal method according to claim 8, the semiconductor layer having a surface, wherein the entire surface of the semiconductor is annealed in a first step at a first energy; and the entire surface of the semiconductor is annealed again in a second step at a second energy, the first step preceding the second step and the first energy greater than the second energy.

10. A laser anneal method for subjecting an amorphous semiconductor layer on a substrate to laser anneal processing to form a polycrystal semiconductor layer, wherein laser anneal processing is performed on one same semiconductor layer in a plurality of steps, said plurality of steps comprising at least two independent passes; and a laser energy is set to be lower for a later annealing processing of said plurality of steps than the laser energy for an earlier annealing processing.

11. A laser anneal method according to claim 10, the semiconductor layer having a surface, wherein the entire surface of the semiconductor is annealed in a first step at a first energy; and the entire surface of the semiconductor is annealed again in a second step at a second energy, the first step preceding the second step and the first energy greater than the second energy.

12. A laser anneal method for subjecting an amorphous semiconductor layer on a substrate to laser anneal processing to form a polycrystal semiconductor layer, wherein said laser anneal processing is performed by irradiating a pulse laser beam for a plurality of times with the irradiating position of the laser beam being shifted relative to said semiconductor layer;

said laser anneal processing is performed on said same semiconductor layer in a plurality of steps, said plurality of steps comprising at least two independent passes; and a laser energy is set to be lower for a later annealing processing of said plurality of steps than the laser energy for an earlier annealing processing.

13. A laser anneal method according to claim 12, wherein the laser energy for the earlier step of the laser anneal processing is set such that an average level of the laser energy in the laser beam is set in the vicinity of an energy level required for making crystal in the polycrystal semiconductor layer to have a maximum grain size, and the laser energy for the later step of the laser anneal processing is set to be lower than said laser energy for the earlier step of the laser anneal processing such that an energy peak level in the laser beam is equal to or lower than an upper limit of the energy level required for making crystal in the polycrystal semiconductor layer to have a maximum grain size.

14. A laser anneal method according to claim 12, the semiconductor layer having a surface, wherein the entire surface of the semiconductor is irradiated by the pulsed laser beam a plurality of times in a first step at a first energy; and the entire surface of the semiconductor is irradiated again by the pulsed laser beam a plurality of times in a second step at a second energy, the first step preceding the second step and the first energy greater than the second energy.

* * * * *